(12) United States Patent
Lee et al.

(10) Patent No.: US 9,035,366 B2
(45) Date of Patent: May 19, 2015

(54) SEMICONDUCTOR DEVICE AND MANUFACTURING METHOD THEREFOR

(71) Applicant: INOTERA MEMORIES, INC., Taoyuan County (TW)

(72) Inventors: Tzung-Han Lee, Taipei (TW); Yaw-Wen Hu, Taoyuan County (TW); Hung Chang Liao, Taipei (TW); Chung-Yuan Lee, Taoyuan County (TW); Hsu Chiang, New Taipei (TW); Sheng-Hsiung Wu, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 9 days.

(21) Appl. No.: 14/025,087

(22) Filed: Sep. 12, 2013

(65) Prior Publication Data

US 2014/0291738 A1    Oct. 2, 2014

(30) Foreign Application Priority Data

Mar. 27, 2013   (TW) .............................. 102110966 A

(51) Int. Cl.
 *H01L 29/78*   (2006.01)
 *H01L 29/66*   (2006.01)
(52) U.S. Cl.
 CPC .......... *H01L 29/78* (2013.01); *H01L 29/66477* (2013.01)

(58) Field of Classification Search
 CPC ............ H01L 29/6659; H01L 29/7833; H01L 29/665; H01L 29/6656; H01L 21/76224; H01L 21/76232; H01L 21/823481; H01L 21/76229; H01L 21/823878; H01L 21/823807
 USPC ........... 438/270, 296; 257/288, 301, 306, 330
 See application file for complete search history.

(56) References Cited

U.S. PATENT DOCUMENTS 8,338,887 B2 * 12/2012 Lindsay et al. ................ 257/330
8,431,933 B2 *  4/2013 Lee et al. ......................... 257/67

* cited by examiner

*Primary Examiner* — Monica D Harrison
(74) *Attorney, Agent, or Firm* — Rosenberg, Klein & Lee

(57) ABSTRACT

A semiconductor electronic device structure includes an active area array disposed in a substrate, an isolation structure, a plurality of recessed gate structures, a plurality of word lines, and a plurality of bit lines. The active area array a plurality of active area columns and a plurality of active area rows, defining an array of active areas. The substrate has two recesses formed at the central region thereof. Each recessed gate structure is respectively disposed in the recess. A protruding structure is formed on the substrate in each recess. A STI structure of the isolation structure is arranged between each pair of adjacent active area rows. Word lines are disposed in the substrate, each electrically connecting the gate structures there-under. Bit lines are disposed above the active areas, forming a crossing pattern with the word lines.

10 Claims, 7 Drawing Sheets

SEMICONDUCTOR DEVICE AND MANUFACTURING METHOD THEREFOR

BACKGROUND

1. Field of the Invention

The instant disclosure relates to structural arrangement of semiconductor electronic device and fabrication method thereof, and pertains particularly to a semiconductor device having recessed gate structure and fabrication method thereof.

2. Description of Related Art

Dynamic Random Access Memory (DRAM) is among the most frequently encountered semiconductor electronic devices today. A DRAM is a type of data storage device that stores bit data in the form of electrical charge in the capacitors thereof. As modern electronic product evolves along the trend of light device-weight and low-physical profile, higher degree of integration and device density of DRAM device becomes a necessary requirement in the effort to achieve further degree of device miniaturization. DRAM, being one of the most commonly used volatile memory device, comprises a plurality of memory cell units. The data/information stored in each memory cell unit of a DRAM is accessed through the word lines and bit lines electrically connected thereto.

DRAM fabrication has been a high competitive business. New and effective structural design/arrangement that enables the achievement of higher degree of integration in a DRAM device is thus imperative for gaining a competitive edge. Like the advancement in electronic device miniaturization, the fabrication technology/technique thereof has also evolved to enable the manufacture of smaller and higher quality transistors underlying these miniature electronic devices.

SUMMARY OF THE INVENTION

The embodiment of the instant disclosure provides a semiconductor electronic device structure and the fabrication method thereof. The semiconductor electronic device structure utilizes a protruding structure formed in a recess of the substrate to increase the contact area between the recessed gate structure and the substrate. In addition, both the recessed gate structure and the protruding structure are embeddedly arranged in the substrate. Such arrangement promotes planarization on the structure surface thereof, increases usable area on the substrate 10, and enables easier deposition of contact pads thereon.

The semiconductor electronic device structure in accordance with the instant disclosure comprise an active area array, an insulation structure, a plurality of recessed gate structures, a plurality of word lines, and a plurality of bit lines. The active area array is disposed in the substrate, and includes a plurality of crossingly arranged active area columns and active area rows, defining a plurality of active areas. The central region of each active area has a pair of recesses formed therein. A first doped area is formed between the pair of recesses in each active area, while a second doped area is respectively formed on the other side of each of the recesses at the opposite ends of the central region in the active area.

A plurality of recessed gate structures is respectively formed in each recess. The bottom portion of each recess is formed with a protruding structure, which protrudes from the bottom surface in the recess. A plurality of word lines is embeddedly disposed in the substrate along the direction of the active area columns, establishing electrical connection with a plurality of recessed gate structures in the corresponding active area columns underneath. A plurality of bit lines are then disposed above the active area, with each bit line electrically connecting a first doped area in each of the active area rows, forming an crossing pattern with the word lines.

Another aspect of the instant disclosure provides a fabrication method for a semiconductor electronic device structure, which comprises the following steps. First, a substrate 10 having an active area array formed thereon is first provided. The active area array, which has a plurality of active areas defined thereon, comprises a plurality of crossingly arranged active area columns and active area rows. An insulation structure is subsequently formed in the substrate. The insulation structure comprises a plurality of shallow trench isolation (STI) structures correspondingly arranged between each pair of adjacent active area columns for providing electrical insulation between each pair of neighboring active area columns. Etching is then carried out on the central region of each active area to form a pair of adjacent recesses, which are penetratively disposed in the substrate. A recessed gate structure is then respectively formed in each recess, wherein the bottom portion of each recess is formed with a protruding structure, which protrudes from the bottom surface in the recess. And then, a first doped area is formed between the pair of recesses in each active area, while a second doped area is respectively formed on the other side of each of the recesses at the opposite ends of the central region in the active area.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. the invention itself, however, as well as a preferred mode of use, further objectives and advantages thereof, will best be understood by reference to the following detailed description of an illustrative embodiments when read in conjunction with the accompanying drawings, wherein:

DETAILED DESCRIPTION OF THE PREFERRED EMBODIMENTS

The instant disclosure will be described more specifically with reference to the following embodiments. It is to be noted that the following descriptions of preferred embodiments are provided herein for purpose of illustration and description. It is not intended to be exhaustive or limiting to the precise form disclosed.

Figure 1:
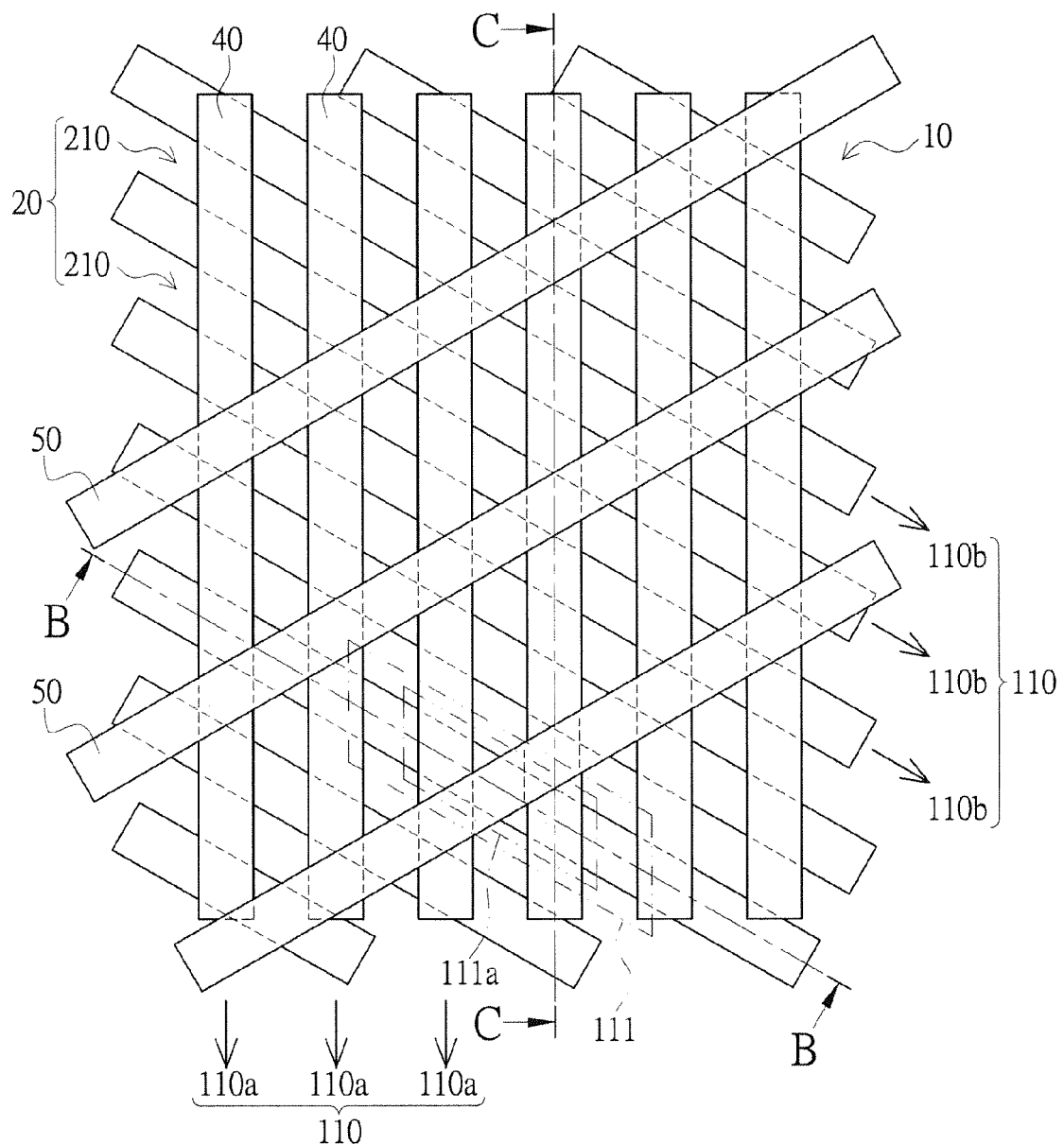
FIG. 1 illustrates a regional plan view of a semiconductor electronic device structure in accordance with the instant disclosure.
Figure 7A:
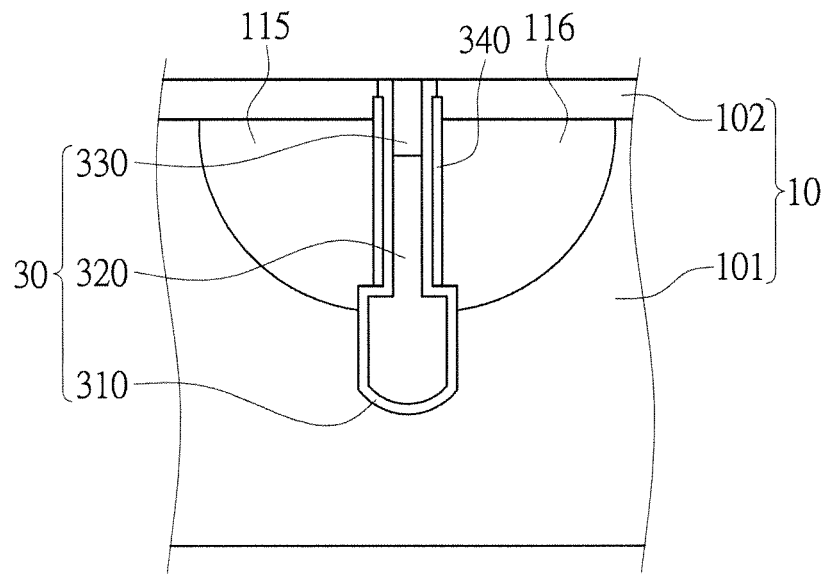
FIG. 7A illustrates a partial cross-sectional view of the semiconductor electronic device structure along the line BB as shown in FIG. 1 during one exemplary fabrication step.
Figure 7B:
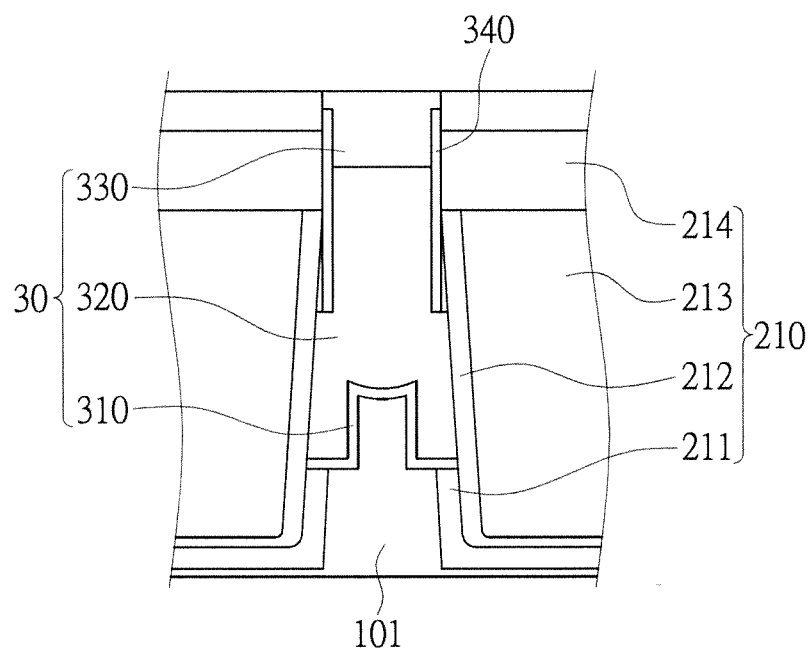
FIG. 7B illustrates a partial cross-sectional view of the semiconductor electronic device structure along the line CC as shown in FIG. 1 during one exemplary fabrication step.

Please refer concurrently to FIG. 1, FIG. 7A, and FIG. 7B. FIG. 1 illustrates a regional plan view of a semiconductor electronic device structure in accordance with one embodiment of the instant disclosure. FIG. 7A illustrates a partial cross-sectional view of the semiconductor electronic device structure along the line BB as shown in FIG. 1 during one exemplary fabrication step. FIG. 7B illustrates a partial cross-sectional view of the semiconductor electronic device structure along the line CC as shown in FIG. 1 during one exemplary fabrication step. The semiconductor electronic device structure 1 comprises an array of active areas (referred to as the active area array 110), an insulation structure 20, a plurality of recessed gate structures 30 (as shown in FIGS. 7A/B), a plurality of word lines 40, and a plurality of bit lines 50.

Figure 2A:
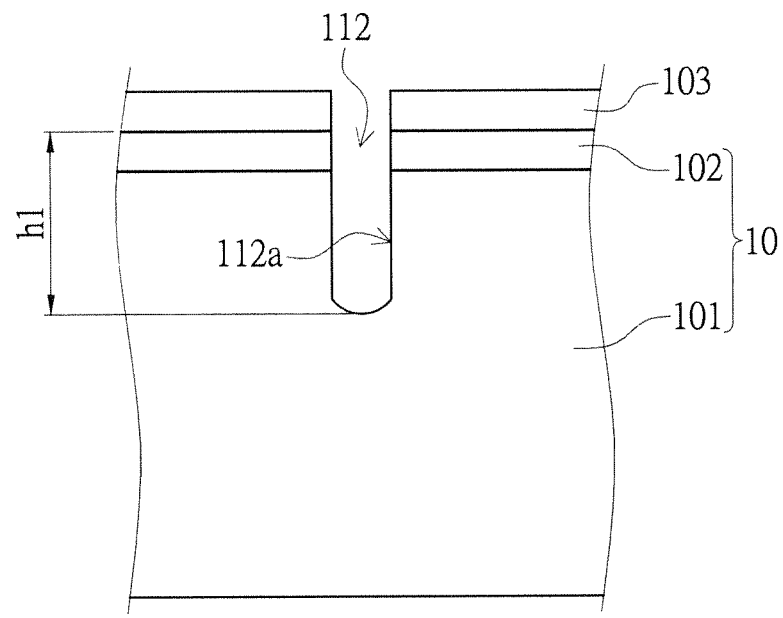
FIG. 2A illustrates a partial cross-sectional view of the semiconductor electronic device structure along the line BB as shown in FIG. 1 during one exemplary fabrication step.
Figure 2B:
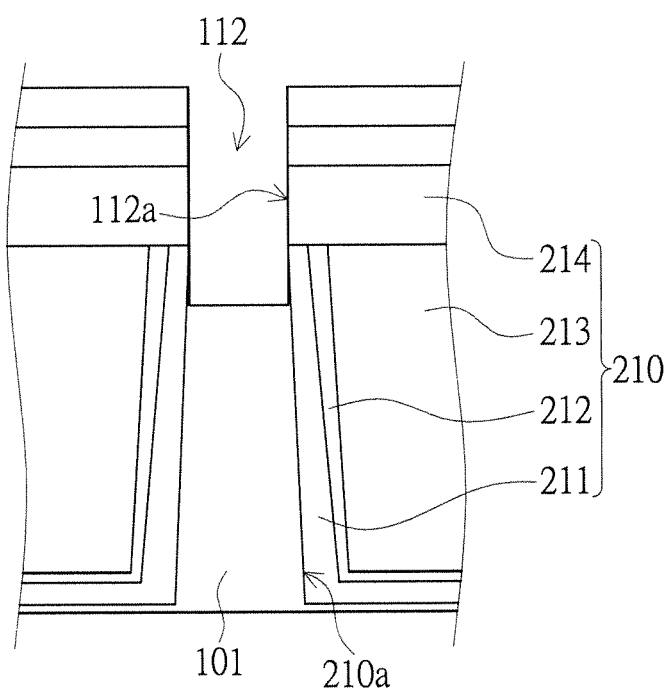
FIG. 2B illustrates a partial cross-sectional view of the semiconductor electronic device structure along the line CC as shown in FIG. 1 during one exemplary fabrication step.

Please refer concurrently to FIG. 1, FIG. 2A, and FIG. 2B, where FIG. 2A illustrates a partial cross-sectional view of the semiconductor electronic device structure along the line BB as shown in FIG. 1 during one exemplary fabrication step, while FIG. 2B illustrates a partial cross-sectional view of the semiconductor electronic device structure along the line CC as shown in FIG. 1 during one exemplary fabrication step. In the fabrication process of the semiconductor electronic device structure 1, a substrate 10 having an array of active areas (active area array 110) formed thereon is first provided. The active area array 110 includes a plurality of crossingly arranged active area columns 110a and active area rows 110b, forming a plurality of active areas 111. Specifically, the substrate 10 can be any structure of suitable semiconductor material having semiconductor surface, for example, doped or undoped silicon wafer. In the instant embodiment, the substrate 10 includes a silicon based substrate 101 and a nitride layer 102. The nitride layer 102 is disposed on the silicon based substrate 101, and can be, as a specific example, a silicon nitride layer. As shown in the figures, the substrate 10 has a plurality of active areas 111 defined thereon. Structurally, the active area array 110 is formed by a plurality of active area rows 110b and active area columns 110a, each being respectively separated by particular pitch distance. In the instant embodiment, the active area 111 can have a length of 5-8 F, and a width of 0.8-1.2 F (F: minimum feature size).

An insulation structure 20 is subsequently formed in the substrate 10. The insulation structure 20 may comprise a plurality of shallow trench isolation (STI) structures 210 correspondingly arranged between each pair of adjacent active area rows 110b for providing electrical insulation between each pair of neighboring active area rows 110b. Specifically, the formation of the STI structures 210 may comprise: respectively forming trenches 210a at both sides of a recess 112 in the substrate 10, and sequentially disposing insulating materials in the form of oxide liner 211, silicon nitride (SiN) liner 212, spin-on dielectric (SOD) layer 213, and high-density plasma (HDP) layer 214 into the trenches 210a. In the instant embodiment, the oxide lining 211 is disposed on the inner walls that define the trench 210a. The oxide liner 211 may be disposed to conformally cover the inner walls that define the trench 210a. The SiN liner 212 may be disposed on the oxide liner 211 and serve as a masking layer during subsequent etching process. The spin-on dielectric layer (SOD) 213, preferably comprising dielectric materials having good hole-filling characteristics suitable for spin-on deposition, is disposed on the SiN liner 212 (and substantially filling the trench 210a). The high-density plasma (HDP) layer 214 is disposed on the spin-on dielectric layer 213. A nitride layer 102 is disposed on the HDP layer 214.

Next, please refer to FIGS. 2A and 2B. Etching is carried out on the central region 111a of each active area 111 to form TWO recesses 112, which are penetratively disposed in the substrate 10. In the fabrication process of the semiconductor electric device structure 1 in accordance with the instant embodiment, a hard mask (layer) 103 may be preferably disposed on the nitride layer 102 prior to the etching step of each active area 111. The hard mask 103 may be disposed on the nitride layer 102 through chemical vapor deposition (CVD) technique, forming a stacked structure. The hard mask 103 may be patterned, for example, to define a circular pattern having diameter of 0.7 F at a location that corresponds to the recess 112. Through the use of patterned hard mask 103, the etching process is carried out on the silicon based substrate 101 and the nitride layer 102, thereby forming the recess 112. The depth (h1) of the recess 112 (i.e., the vertical distance from the bottom inner surface of the recess 112a to the surface of the substrate 10, as shown in FIG. 2A) may be 80 nm, while the diameter (r1) thereof may be 0.7 F.

Figure 3A:
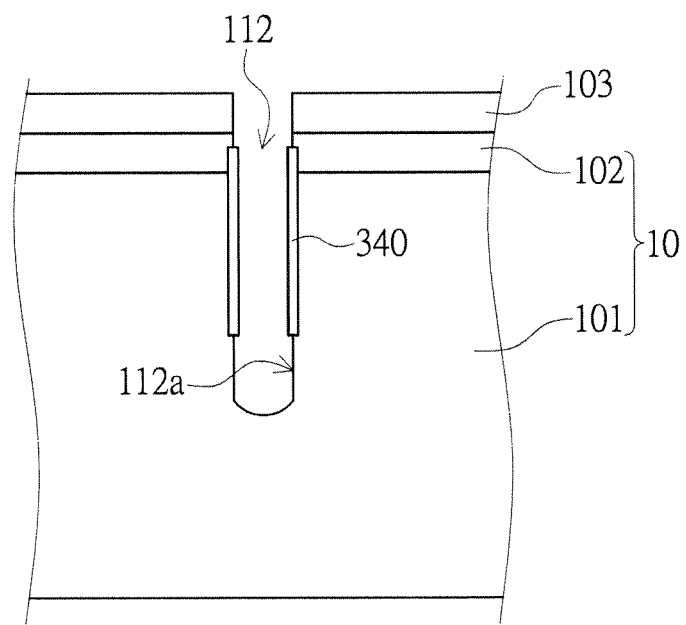
FIG. 3A illustrates a partial cross-sectional view of the semiconductor electronic device structure along the line BB as shown in FIG. 1 during one exemplary fabrication step.
Figure 3B:
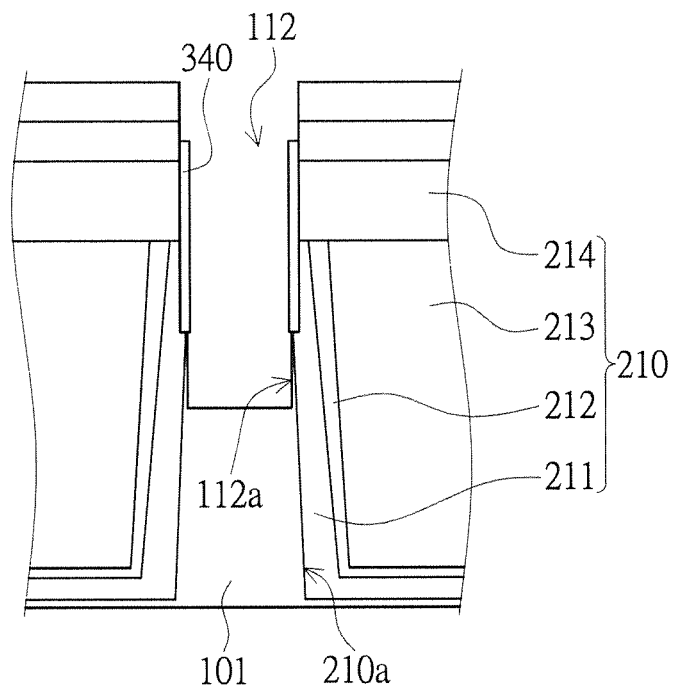
FIG. 3B illustrates a partial cross-sectional view of the semiconductor electronic device structure along the line CC as shown in FIG. 1 during one exemplary fabrication step.

Please refer to FIGS. 3A and 3B. FIG. 3A provides a partial cross-sectional view of the semiconductor electronic device structure 1 along the line BB as shown in FIG. 1 during one exemplary fabrication step, and FIG. 3B provides a partial cross-sectional view of the semiconductor electronic device structure 1 along the line CC as shown in FIG. 1 during one exemplary fabrication step. A barrier structure 340 is respectively formed on the surface of the recess side wall 112a to selectively cover the portion of the side wall that comprises the substrate 10 and the STI structure 210. Specifically, the barrier structure 340 may be formed by first depositing a conformally covering barrier liner material over hard masking layer 103 having the recess 112 defined therein, thereby conformally covering the inner recess surface 112a. An etching step is then performed to selectively remove the barrier liner material from the surface of the hard mask 103 and the bottom portion of the recess 112 to accomplish the formation of the barrier structure 340 in each of the recesses 112. In the instant embodiment, the barrier structure 340 is attached to the portion of the substrate 10 and the STI structure 210 that cooperatively define the side wall 112a of the recess 112. Suitable material for the barrier structure 340 includes silicon nitride (SiN) and aluminum oxide (Al2O3), which in turn respectively constitute a SiN liner and a Al2O3 liner. Moreover, it's worth mentioning that, due to the fact that the depth (h1) of the recess 112 is greater than the depth and thickness of the HDP layer 214 of the STI structure 210, the barrier structure 340 can be arranged to fully cover the portion of recess side wall 112a that corresponds to the HDP layer 214.

Figure 4A:
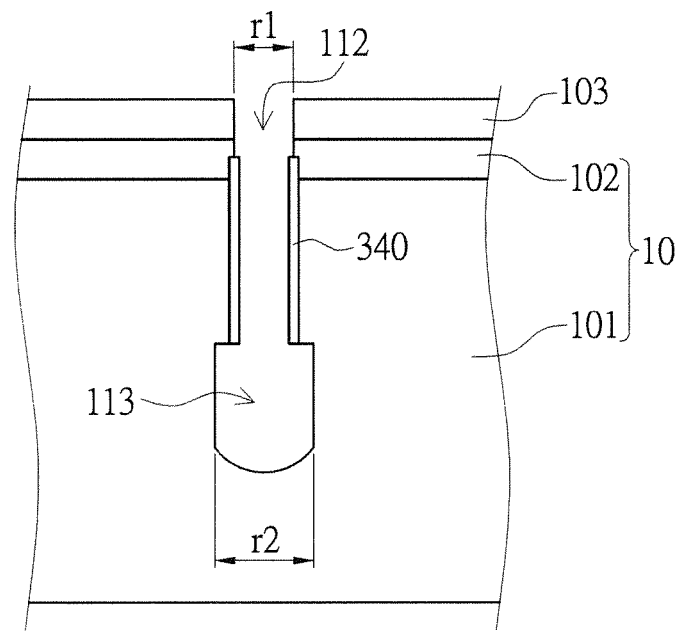
FIG. 4A illustrates a partial cross-sectional view of the semiconductor electronic device structure along the line BB as shown in FIG. 1 during one exemplary fabrication step.
Figure 4B:
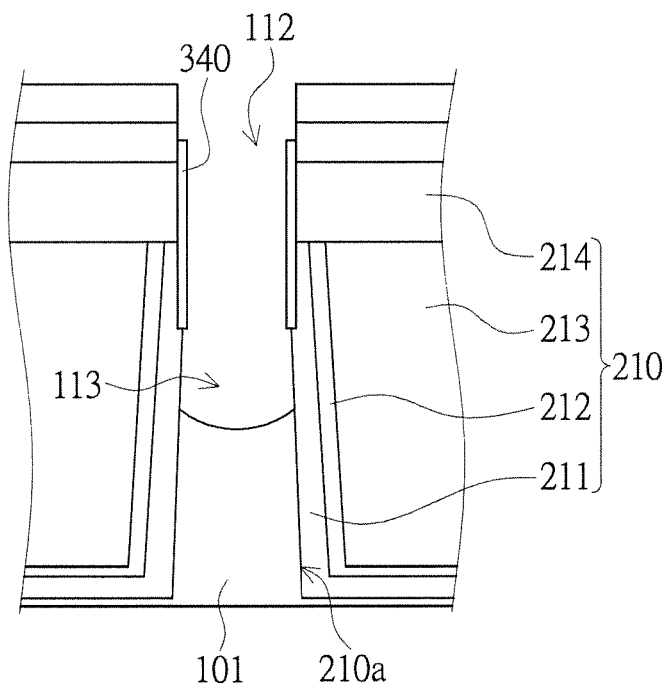
FIG. 4B illustrates a partial cross-sectional view of the semiconductor electronic device structure along the line CC as shown in FIG. 1 during one exemplary fabrication step.

Etching is then performed on the surface 112a that defines the bottom portion of the recess 112 in the substrate 10, enlarging the bottom region of the recess and forming an etched space 113. Referring to FIGS. 3A and 3B, in the formation of the etched space 113, a dry etching process may be first performed on the portion of the silicon based substrate 101 that corresponds to the bottom portion of the recess 112, thereby extending/increasing the depth of the recess downward into the substrate. Please refer to FIGS. 4A and 4B, which respectively show a partial cross-sectional view of the semiconductor electronic device structure 1 along the line BB as shown in FIG. 1, and a partial cross-sectional view of the semiconductor electronic device structure 1 along the line CC as shown in FIG. 1 during one exemplary fabrication step. An isotropic etching process (such as wet etching) is then carried out on the bottom portion of the recess 112 in the substrate 10, thereby widening the bottom region and forming the etched space 113. Specifically, the bottom portion of the recess 112 in the substrate 10 may be laterally enlarge/widen through isotropic (wet) etching, and the material of the substrate 10 that remained on the sidewall portion of the STI structure 210 (as shown at the region pointed by the arrow of 112a in FIG. 3B) may be removed, thus forming the etched space 113. The lateral dimension of the etched space 113 is greater than that of the recess 112. In the instant embodiment, the etched space 113 has a lateral cross-section that resembles the shape of a bottle, where the diameter (r2) of the etched space 113 is greater than the diameter (r1) of the recess 112, and can be, for example, 1.2 F. However, in other embodiments, the lateral cross-section of the etched space 113 may be the shape of a tear-drop or the shape of a ball. The specific shape and dimension of the etched space 113 is known to persons of ordinary skill in the art, and shall be arranged in accordance to specific practical operating requirements.

Figure 5A:
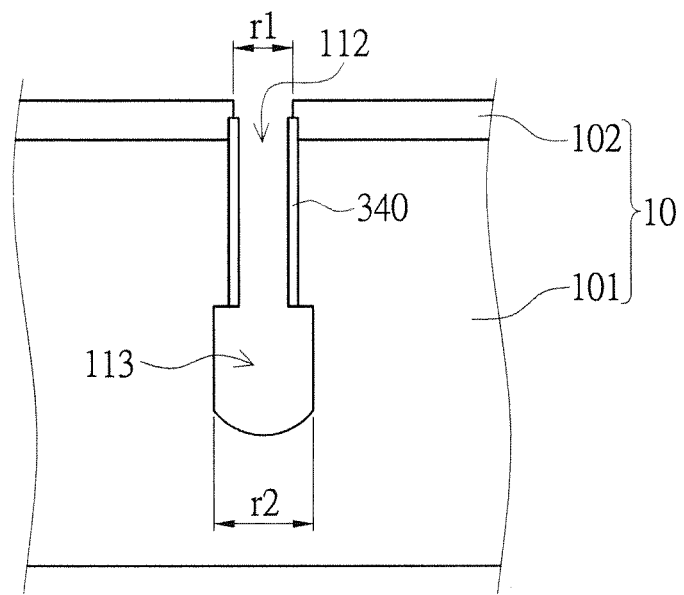
FIG. 5A illustrates a partial cross-sectional view of the semiconductor electronic device structure along the line BB as shown in FIG. 1 during one exemplary fabrication step.
Figure 5B:
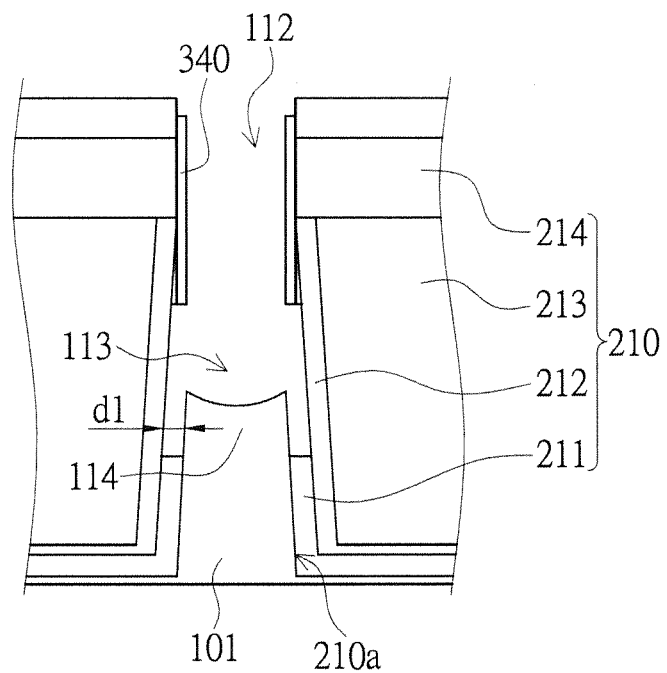
FIG. 5B illustrates a partial cross-sectional view of the semiconductor electronic device structure along the line CC as shown in FIG. 1 during one exemplary fabrication step.

Please refer to FIGS. 5A and 5B, which respectively show a partial cross-sectional view of the semiconductor electronic device structure 1 along the line BB as shown in FIG. 1, and a partial cross-sectional view of the semiconductor electronic device structure 1 along the line CC as shown in FIG. 1 during one exemplary fabrication step. During the above fabrication step, the hard mask 103 is removed, and the STI structure 210 at the bottom portion of the recess 112 are partially etched (at the respective sides thereof, as shown in FIG. 5B), thereby forming a fin-like protruding structure 114 on the inner surface 112a that defines the bottom portion of each recess 112 in the substrate 10. By way of example, the protruding structure 114 may be formed by partially etching the oxide liner 211 of the STI structure 210a located at the two respective lateral sides of the recess 112. Specifically, hydrofluoric acid may be used (through HF dipping) in the recess 112 for removing portions of the oxide liner 211 located at the two respective lateral sides of the silicon substrate 101 (FIG. 5B), while the SiN liner 212 serves as an etching mask to prevent undesired over etching of the hydrofluoric acid into the STI structure 210. Thus, the protruding structure 114 may be formed from the silicon substrate 101 in each of the recesses 112, where the protruding structure 114 protrudes from the bottom surface 112a of the recess 112. In the instant embodiment, the cross-sectional shape of the protruding structure 114 resembles the shape of a fin. A gap (d1) is formed between the STI structure 210 and the side surface of the protruding structure 114, with a width substantially equals the thickness of the oxide liner 211.

Figure 6:
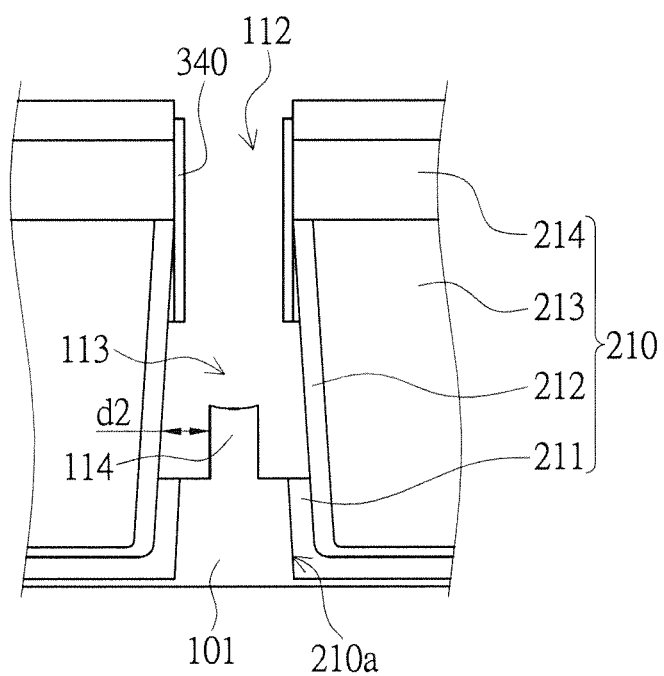
FIG. 6 illustrates a partial cross-sectional view of the semiconductor electronic device structure along the line CC as shown in FIG. 1 during one exemplary fabrication step.

Please refer to FIG. 6, which shows a partial cross-sectional view of the semiconductor electronic device structure 1 along the line CC as shown in FIG. 1 during one exemplary fabrication step. As shown in FIG. 6, in some applications, it is preferable to reduce the width of the protruding structure 114 (thereby increase the aspect ratio thereof) by performing further partial etching on the substrate 10 in the bottom region of each recess 112. For example, as shown in FIG. 6, the gap (d2) formed between the STI structure 210 and the side surface of the protruding structure 114 is further widened, thus having a width substantially greater than the thickness of the oxide liner 211.

Please refer to FIGS. 7A and 7B, which respectively show a partial cross-sectional view of the semiconductor electronic device structure 1 along the line BB as shown in FIG. 1, and a partial cross-sectional view of the semiconductor electronic device structure 1 along the line CC as shown in FIG. 1 during one exemplary fabrication step. Please refer concurrently to FIG. 7A and FIG. 1, which show the cross-section structure of the semiconductor structure 1 along line B-B. Ion-implantation is performed to form doped areas 115/116 of different polarity in the portions of the silicon substrate 101 at the respective sides of each recess 112, thereby forming a first doped area 115 and a second doped area 116 at the respective lateral sides of the recess 112. Moreover, two adjacent recesses 112 may share a doped area of the same polarity there-between. For example, please refer to the box of dotted lines in FIG. 1, which defines the active area 111 having a central region 111a. Specifically, along the B-B direction, the central region 111a (defined by the inner box) comprises two recesses 112 (at the respective intersections between the two active area columns 110a and the slantingly extending active area row 110b along the B-B line) and a separation region in between. A single doped area of a first polarity (e.g. the first doped area 115) may be formed in the region of separation between the two recesses 112 in the central region 111a, while doped areas of a second polarity (e.g. the second doped area 116) may be correspondingly arranged at the other side of each of the recesses 112, respectively. The first and the second doped areas 115/116 formed by ion-implantation may be subsequently used to define source and drain electrodes. A recessed gate structures 30 is then respectively formed in each of the recesses 112. Specifically, a gate dielectric layer 310 is selectively disposed on the surface 112a in the recess 112, covering the surface of the protruding structure 114.

Gate material is then disposed into each recess 112, forming the gate material layer 320. The gate material layer 320 and the substrate 10 are electrically separated by the gate dielectric layer 310. A gate covering layer 330 is subsequently formed in the recess 112 on the gate material layer 320 to accomplish the formation of the recessed gate structures 30. Suitable material for the gate dielectric layer 310 includes silicon oxide. Suitable material for the gate material layer 320 includes conductors such as metal and metal silicide, for example, copper, gold, aluminum, tungsten silicide, titanium silicide, and cobalt silicide. Suitable material for the gate covering layer 330 includes insulators such as silicon oxide and silicon nitride.

Please refer back to FIG. 1, a plurality of word lines 40 are embeddedly disposed in the substrate 10, with the bottom portion thereof in electrical connection with a plurality of recessed gate structures 30 in the corresponding active area columns 110a. A plurality of bit lines 50 are then disposed above the active area 111, with each bit line 50 electrically connecting the first doped areas 115 in the corresponding active area rows 110b, forming an crossing pattern with the word lines 40. It is worth noting that, in the instant embodiment, the word lines 40 and the bit lines 50 do not cross at a right angle (90-degree angle). As mentioned previously, each defined active area 111 includes two word lines 40 passing there-on, thereby defining two memory cells. Each bit line 50 may establish electrical connection with the corresponding first doped areas 115 via bit line contact plugs arranged between the memory cells, enabling access/process to the pair of adjacent memory cells by the bit line 50. Moreover, each pair of neighboring active areas 111 in the adjacent active area rows 110b is arranged in a separately offset manner by a particular offset distance. The offset distance may be, preferably, twice the width of the word line 40 (i.e. 2 F).

The formation of the semiconductor electronic device structure 1 is generally complete upon the formation of the bit lines 50. As shown in FIG. 1, the semiconductor electronic device structure 1 in accordance with one embodiment of the instant disclosure comprises an active area array 110, an insulation structure 20, a plurality of recessed gate structures 30, a plurality of word lines 40, and a plurality of bit lines 50. The active area array 110 is disposed in the substrate 10, and includes a plurality of crossingly arranged active area columns (110a) and active area rows (110b), defining a plurality of active areas (111). The central region 111a of each active area 111 has a pair of recesses 112 formed therein. A first doped area 115 is formed between the pair of recesses 112 in each active area 111, while a second doped area 116 is respectively formed on the other side of each of the recesses 112 (at the opposite ends of the central region 111a in the active area 111).

An insulation structure 20 is formed in the substrate 10, and comprises a plurality of shallow trench isolation (STI) structures correspondingly arranged between each pair of adjacent active area rows 110b for providing electrical insulation between each pair of neighboring active area rows 110b. A plurality of recessed gate structures 30 is respectively formed in each recess 112. The bottom portion of each recess 112 is formed with a protruding structure 114, which protrudes from the bottom surface 112a in the recess 112. A plurality of word lines 40 is embeddedly disposed in the substrate 10 along the direction of the active area columns 110a, establishing electrical connection with a plurality of recessed gate structures 30 in the corresponding active area columns 110a underneath. A plurality of bit lines 50 are then disposed on the active area 111, with each bit line 50 electrically connecting the first doped areas 115 in the corresponding active area rows 110b, forming an crossing pattern with the word lines 40.

In accordance with the instant embodiment, the present disclosure also provides a method for fabricating a semiconductor electronic device structure 1. Moreover, through the protruding structure 114 formed in the recess 112 on the substrate 10, the contact area between the recessed gate structure 30 and the substrate 10 can be increased. Furthermore, the buried/embedded arrangement of the recessed gate structure 30 and the protruding structure 114 of the semiconductor structure 1 may facilitate planarization on the structure surface thereof, thus increase usable area on the substrate 10 and enable easier deposition of contact pads thereon. In addition, the non-perpendicular arrangement between the bit lines 40 and the word lines 50 may enable the semiconductor electronic device 1 to resume a smaller physical dimension.

While the invention has been disclosed with respect to a limited number of embodiments, numerous modifications and variations will be appreciated by those skilled in the art. It is intended, therefore, that the following claims cover all such modifications and variations that may fall within the true spirit and scope of the invention.

What is claimed is:

1. A semiconductor electronic device structure, comprising:
    a substrate having an active area array disposed therein, the active area array including a plurality of crossingly arranged active area columns and active area rows, defining a plurality of active areas,
        wherein the central region of each active area has a pair of recesses disposed therein,
            wherein the bottom portion of each recess is formed with a protruding structure protruding from a bottom surface thereof,
        wherein a first doped area is formed between the pair of recesses in the central region of each active area,
        wherein a second doped area is respectively formed on the opposite ends of the central region in each active area;
    an insulation structure formed in the substrate, comprising a plurality of shallow trench isolation structures correspondingly arranged between each pair of adjacent active area rows;
    a plurality of recessed gate structures respectively formed in each recess;
    a plurality of word lines embeddedly disposed in the substrate along the direction of the active area columns in electrical connection with a plurality of recessed gate structures in the corresponding active area columns underneath; and
    a plurality of bit lines disposed above the active area correspondingly in electrical connection with a first doped area in each of the active area rows and forming a crossing pattern with the word lines.

2. The semiconductor electronic device structure of claim 1, wherein the word lines and the bit lines cross at a non-ninety degree angle.

3. The semiconductor electronic device structure of claim 2, wherein each pair of neighboring active areas in the adjacent active area rows is arranged in a separately offset manner by an offset distance of substantially twice the width of the word line.

4. The semiconductor electronic device structure of claim 1, wherein a cross-sectional shape of the protruding structure resembles the shape of a fin.

5. The semiconductor electronic device structure of claim 1, wherein the recessed gate structure comprises a barrier structure respectively formed on the side-wall in the recess to selectively cover the portion of the side wall that comprises the substrate and the shallow trench isolation structure.

6. A fabrication method of a semiconductor electronic device structure, comprising steps of:
    providing a substrate having an active area array disposed therein,
        wherein the active area array includes a plurality of crossingly arranged active area columns and active area rows defining a plurality of active areas;
    forming an insulation structure in the substrate,
        wherein the insulation structure comprises a plurality of shallow trench isolation structures correspondingly arranged between each pair of adjacent active area rows;
    etching the central region of each active area to form a pair of recesses
        wherein the bottom portion of each recess is formed with a protruding structure protruding from the bottom surface in the recess;
    forming a recessed gate structure in each of the recesses;
    in each of the active areas,
        forming a first doped area between the pair of recesses, and
        forming a second doped area respectively at the opposite ends of the central region thereof.

7. The fabrication method of a semiconductor electronic device structure of claim 6, wherein a cross-sectional shape of the protruding structure resembles the shape of a fin.

8. The fabrication method of a semiconductor electronic device structure of claim 6, wherein the forming of recessed gate structure comprises the steps of:
 in each of the recesses,
  forming a barrier structure on the side-wall therein to selectively cover the portion of the side wall that comprises the substrate and the shallow trench isolation structure,
  forming an etched space therein by etching the substrate at the bottom portion of the recess, and
  partially etching the shallow trench isolation structure located at the two respective lateral sides of the recess.

9. The fabrication method of a semiconductor electronic device structure of claim 8, further comprising the steps of:
 reducing the width of the protruding structure by partially etching the substrate in the bottom region of each recess.

10. The fabrication method of a semiconductor electronic device structure of claim 8,
 wherein the forming an insulation structure comprises the steps of:
  respectively forming trenches at both sides of a recess in the substrate, and
  sequentially disposing an oxide liner, a silicon nitride liner, a spin-on dielectric layer, and a high-density plasma layer into the trenches; and
 wherein the partial etching step of the shallow trench isolation structure comprises:
  partially etching the oxide liner of the shallow trench isolation structure located at the two respective lateral sides of the recess in the substrate.

* * * * *